United States Patent [19]

Rupprecht et al.

[11] Patent Number: 5,390,343
[45] Date of Patent: Feb. 14, 1995

[54] METHOD OF TUNING A RADIO RECEIVER USING RDS INFORMATION

[75] Inventors: Matthias Rupprecht, Straubenhardt; Willy Schmidt; Wolfgang Trinks, both of Karlsruhe, all of Germany

[73] Assignee: Becker GmbH, Karlsbad, Germany

[21] Appl. No.: 941,109

[22] PCT Filed: Mar. 4, 1992

[86] PCT No.: PCT/EP92/00481
§ 371 Date: Dec. 30, 1992
§ 102(e) Date: Dec. 30, 1992

[87] PCT Pub. No.: WO92/16049
PCT Pub. Date: Sep. 17, 1992

[30] Foreign Application Priority Data

Mar. 4, 1991 [DE] Germany ............... 4106852

[51] Int. Cl.⁶ ............................................. H04B 1/16
[52] U.S. Cl. ........................... 455/161.3; 455/166.2; 455/186.1; 455/194.1
[58] Field of Search ............... 455/166.1, 166.2, 161.1, 455/161.2, 161.3, 186.1, 184.1, 194.1, 185.1, 226.2, 226.3, 134, 135

[56] References Cited

U.S. PATENT DOCUMENTS

| | | | |
|---|---|---|---|
| 4,641,367 | 2/1987 | Van Dearson et al. | 455/161.1 |
| 4,783,658 | 11/1988 | Nakano et al. | 455/63 |
| 4,881,273 | 11/1989 | Koyama et al. | 455/166.2 |
| 5,027,431 | 6/1991 | Tanaka et al. | 455/166.1 |
| 5,212,818 | 3/1993 | Fukami | 455/166.1 |
| 5,222,254 | 6/1993 | Verron et al. | 455/166.2 |

FOREIGN PATENT DOCUMENTS

| | | |
|---|---|---|
| 0211366 | 2/1987 | Germany . |
| 0403744 | 4/1990 | Germany . |
| 9103102 | 3/1991 | Germany . |
| 0078528 | 3/1989 | Japan ............... 455/161.3 |

*Primary Examiner*—Curtis Kuntz
*Assistant Examiner*—Mark D. Wisler
*Attorney, Agent, or Firm*—Sixbey, Friedman, Leedom & Ferguson; Evan R. Smith

[57] ABSTRACT

For tuning a microcomputer-controlled radio receiver to the one of several transmitters broadcasting the same program best satisfying the requirements for quality of reception the information obtained from the RDS data stream is memorized in a table of the alternative transmitters and sorted in the priority of the corresponding quality of reception. In establishing the priority in the table of alternative transmitters not only quality evaluation information but also a current status information depending on the time and/or distance covered is determined and evaluated. Particularly for mobile radio receivers having only a single receiver section this method alleviates the circumstances that obtaining the information determining the priority for all alternative frequencies contained in the RDS data stream is considerably time-consuming and that the information held in the table may reflect the conditions at any one time incompletely or incorrectly.

15 Claims, 5 Drawing Sheets

| FREQUENCY | PI-MSB | PI-LSB | COUNTER |
|---|---|---|---|
| 87.5 | D0H | E3H | FFH |
| . | . | . | . |
| . | . | . | . |
| . | . | . | . |
| . | . | . | . |
| 108.0 | D0H | F1H | 00H |

FIG. 3

| FREQUENCY | QUALITY | FLAG | COUNTER | |
|---|---|---|---|---|
| 98.4 | 81H | 11011000 | FFH | 1st GROUP |
| 101.1 | 99H | 01011000 | A0H | |
| . | . | . | . | |
| 89.9 | 60H | 01011000 | 00H | 2nd GROUP |
| 94.3 | 90H | 01101000 | 00H | |
| . | . | . | . | |
| 97.0 | C4H | 0110000 | 50H | 3rd GROUP |
| . | . | . | . | |

METHOD OF TUNING A RADIO RECEIVER USING RDS INFORMATION

BACKGROUND OF THE INVENTION

The invention relates to a method of tuning a microcomputer-controlled radio receiver to the one of several transmitters broadcasting the same program best satisfying reception quality requirements by making use of RDS information and preferably by using only one receiving section. The method according to the invention is particularly intended for application in mobile radio receivers, especially car radios.

Since the availability of RDS information it has become possible to automatically tune also radio receivers having merely one receiving section to the one of several transmitters broadcasting the same program best satisfying the requirements of reception quality. The RDS information also facilitates achieving radio receivers having two receiving sections, one of which is continuously involved in checking the alternative transmitter frequencies transmitted in the RDS information.

To be able to select from the alternative transmitter frequencies as contained in the RDS data stream the one actually having the best quality of reception, each of the individual alternative transmitter frequencies must be tested. Since up to 40 alternative transmitter frequencies can be identified to the transmitter set in each case, checking all of the frequencies necessitates a time duration of considerable length. Although the quality of reception of a transmitter can be measured relatively quickly on the basis of the field strength and other signals indicating the occurrence of noise in reception (multi-path reception, adjacent and co-channel noise), determining the identity code of a transmitter set for checking takes up a time period of up to 1 second. Checking the identity code is necessary, however, since due to random overlapping of reception sectors ambiguities may arise. Due to special conditions of reception it is possible that a program can be received under a given frequency contained in the RDS data stream which is different to that to which the transmitter is momentarily tuned, the alternative frequencies of which are included in the data stream.

Since checking the quality of reception and the identity code of all alternative frequencies listed in the RDS data stream necessitates a considerable time period there is the problem particularly in mobile radio receivers that the information obtained in checking the alternative transmitters is no longer current at the moment at which tuning to an alternative transmitter is required, due to the quality of reception of the transmitter tuned momentarily deteriorating. This problem is particularly serious in radio receivers having only a single receiver section since this is to be tuned to an alternative frequency only for a very brief time so that the changeover does not become a nuisance. Checking the identity code is only possible when the receiver remains tuned to the alternative frequency for a time period of at least a few hundred milliseconds which requires that the quality of reception is sufficient.

SUMMARY OF THE INVENTION

The invention creates a method of tuning a microcomputer-controlled radio receiver by making use of the RDS information which can be applied to both two-receiver and single-receiver concepts, the advantages of which are particularly obvious with receivers having only a single receiver section and with mobile receivers. The invention is based on the knowledge that in tuning to an alternative frequency stated in the RDS data stream the probability of selecting the one actually satisfying the best requirements for quality of reception can be considerably enhanced when dynamic handling of the established quality evaluation information and identity code results. The data obtained from the RDS data stream is first memorized in a table of alternative transmitters. As soon as tuning to a transmitter occurs, the frequency of which is held in the table, a quality evaluation information is memorized in relation to this frequency. In tuning to one of the alternative frequencies of the table the priority resulting from the quality evaluation information memorized and corresponding in each case is taken into account. This priority is developing, however, all the time. For each alternative frequency a current status information is memorized in the table of alternative transmitters reflecting how new the information is, as available regarding this alternative frequency, this particularly in respect to the quality evaluation information and the identity information. Determining the priority in the table of alternative transmitters also takes into account the current status information. For example, an alternative frequency memorized in the table for which good quality of reception and a corresponding identity code was measured at a given point in time may sink in priority within a few minutes below an alternative frequency at which a lesser quality of reception was measured, when the measurement is still current, i.e. made for but a few seconds prior.

In making the selection among the alternative frequencies memorized in the table the identity code has a special significance. Switching over to a transmitter broadcasting an unwanted program should possibly be avoided. On the other hand, a lot of time is required particularly for obtaining the identity code of the individual alternative frequencies. In accordance with one special embodiment of the invention a selection is thus made in the table of alternative transmitters by at least two groups being formed, the first of which contains the alternative frequencies higher in the priority, the identity code of which was recognized in checking as being appropriate. All alternative frequencies having no known identity code or for which even a wrong identity code was established are rated lower in priority even when the corresponding quality evaluation information would indicate a good quality of reception. In assigning the alternative frequencies to the groups of the alternative transmitter table too, the current status information is taken into account with preference. The association with the group highest in priority thus depends not only on the identity code having been recognized as being correct, but also on the information in this respect also being current. If, since recognizing the corresponding identity code 10 minutes, for instance, have already passed, this information is regarded as being obsolete and the alternative frequency concerned is removed from the first group and sorted into a lower group.

To minimize the number of changeovers, particularly on radio receivers having only one receiving section, checking the alternative frequencies from the table of alternative transmitters is limited to the first group when the transmitter tuned at that time has a predetermined minimum quality of reception. It is then relatively improbable that one of the alternative frequencies belonging to another group results in a better quality of reception and exhibiting a corresponding identity code.

In the alternative frequencies contained in the first group the identity code is very reliable. A further embodiment of the invention involves no check of the identity code having to be made when changing over to one of the alternative frequencies in the first group. When checking the identity code can be neglected it is possible to check the alternative frequencies contained in the first group very much more frequently since measuring the quality of reception can be done very quickly and is hardly heard at all as a disturbance (noise).

When tuning to an alternative frequency for which no safe information is available as regards the identity code, muting is required to ensure that no unwanted program becomes audible. One special aspect of the invention now involves no muting whilst the identity code is being checked when a changeover is made to one of the alternative frequencies for which a safe identity code is available. This procedure prevents interruption of audible reception due to muting. Since the first group of alternative frequencies only lists those available for a safe and still current status information via the identity code, muting is left out when checking the identity code every time a changeover is made to an alternative frequency of the first group.

Every changeover from the receiving frequency tuned at the time to one of the alternative frequencies results in—albeit slight—interruption of audible reception. It must, therefore, be attempted to execute as few changeovers to alternative frequencies as possible. On the other hand, not checking an alternative frequency which would result in a significantly better receiving frequency than the current one should also be avoided, because the quality of reception of the current transmitter frequency is still acceptable. In a further embodiment of the invention, therefore, it is proposed to check the currently tuned transmitter frequency as regards best quality of reception by comparing it to the alternative frequencies as a function of the quality evaluation information measured at the time falling below a threshold value which is formed in the following way:

a) when tuning to this current transmitter frequency the quality evaluation information is established over a given time span;
b) the resulting average value is diminished by a prescribed amount;
c) this diminished average value forms the threshold value which is subsequently again elevated as a function of the time passed and is able to reattain the undiminished average value after a few minutes.

Each setting to a specific transmitter frequency resulting in best-possible quality of reception at the time of the setting is considered as being provisional. The threshold value is initially set lower by a predescribed amount than the measured average value of the quality evaluation information. In this way it is achieved that a new check of other alternative frequencies results immediately after the setting to a certain transmitter frequency. But now the threshold value increases continuously with time. The quality evaluation information as measured all the time is compared to the threshold value. Quality of reception can now remain the same, become better or even worse, When it drops below the threshold value a changeover to another alternative frequency could result. However, this changeover is not enabled until a further criterion is satisfied, namely then when a momentary interference of reception quality (noise) is established. Particularly suitable is noise due to multi-path reception resulting in a brief reduction in quality. The associated reception noise can be made use to change over to an alternative frequency.

When the identity code of the alternative frequency to which changeover is made is known and still current no muting results whilst the identity code is being checked so that - when the reception quality of the alternative frequency involved is sufficient - neither the noise in reception nor the changeover in audible reception is subjectively a nuisance.

It is particularly useful to quickly increase the threshold value with time, since the quicker this happens, the higher the quality of reception of the currently tuned transmitter. In this way it is avoided that a transmitter which is received with relatively good quality of reception prevents tuning to an alternative frequency over a lengthy period of time which would result in an even better quality of reception.

So that after a changeover has been made to an alternative frequency optimum requirements for subsequent checking the next alternative frequency are created, it is further provided that after each check a new priority of alternative frequencies is established and that these alternative frequencies are sorted into the table of alternative transmitters according to the new priority. It is then usual that checking only one alternative frequency in the table - namely the alternative frequency highest in priority in the table - results in the best-possible quality of reception for the circumstances concerned. Apart from the first group of alternative frequencies, the identity code of which is known, correct and still current, two further groups are preferably formed, namely a second group having alternative frequencies the identity code of which is unknown or recognized as being wrong or correct, but which due to the current status information is considered obsolete, and a third group having alternative frequencies the identity code of which was recognized as being wrong and which due to the current status information is not considered as being obsolete. The second group is rated higher in priority than the third group.

BRIEF DESCRIPTION OF THE DRAWING

Further features and advantages of the invention will now be described with reference to the drawing in which.

DETAILED DESCRIPTION

Figure 1:
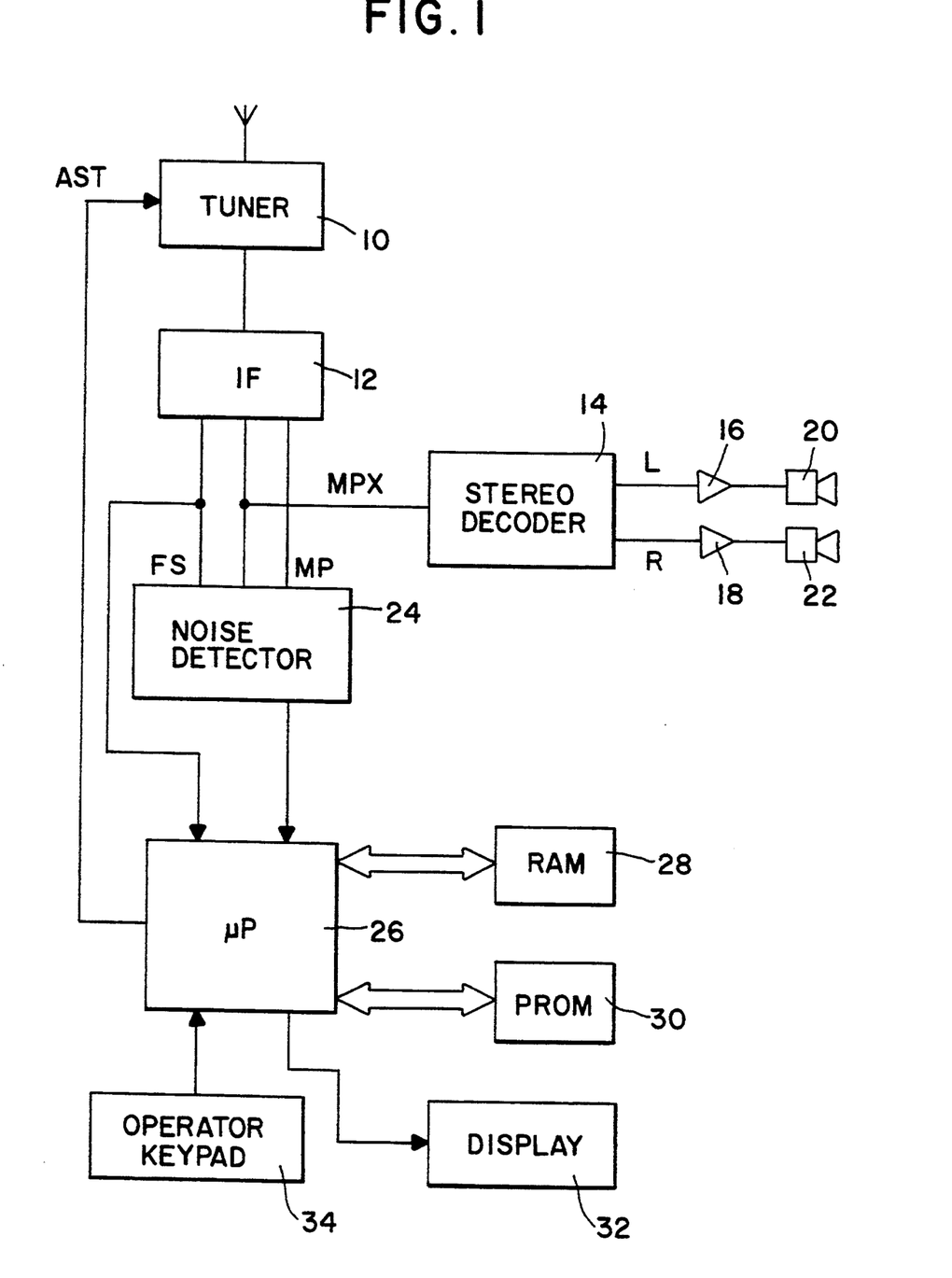
FIG. 1 is a block diagram of a radio receiver for implementing the method according to the invention.

In a conventional arrangement the radio receiver shown in FIG. 1 contains a tuner 10 to which the antenna signal is applied, an intermediate frequency section 12, a stereo decoder 14 at the input of which the MPX signal is applied from the output of the intermediate frequency section 12, and amplifier stages 16, 18 for driving the loudspeakers 20, 22. At the inputs of a noise detector 24 are also applied, in addition to the MPX signal, a field-strength signal FS and a signal MP signalizing the presence of multi-path reception noise received.

For controlling the radio receiver a microprocessor 26 is provided. The output signal ST of the noise detector 24 and the field-strength signal FS are applied to the microprocessor 26. The microprocessor 26 produces a tuning signal AST for the tuner 10. The RAM 28 and a PROM 30 makes the microprocessor 26 a microcomputer. Connected to this microcomputer are furthermore a display unit 32 and an operator keypad 34.

Figure 2:
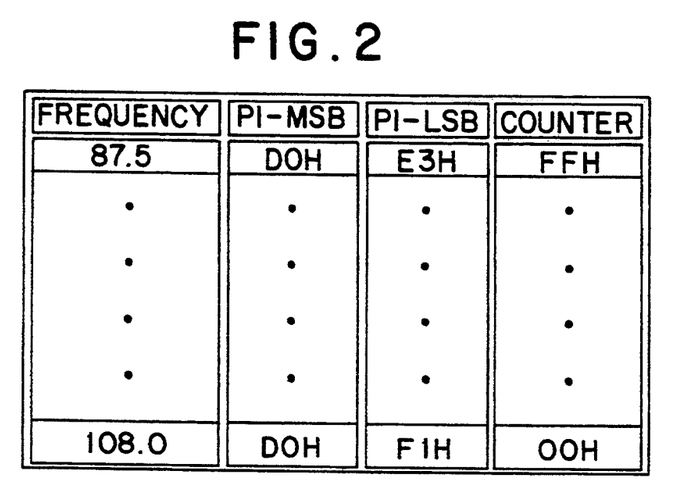
FIG. 2 is a first table as used in the method.

To describe the method according to the invention it will now be supposed that the radio receiver has been switched on and no information as to alternative frequencies is yet present. As soon as the tuner 10 is set to the wanted program, for example by pressing a station key on the operator keypad 34, the RDS information is received as a stream of binary data continuously, in addition to the program, via a subcarrier frequency of 57 kHz. Among other things this data stream contains the alternative frequencies (AF) with respect to the currently set receiving frequency and the identity code (PI) of the currently set transmitter. The identity code or PI code of the currently set transmitter is generally available a few hundred milliseconds after the corresponding reception frequency is set for the first time. In the method according to the invention the alternative frequencies received in the data stream are now memorized in a first table as shown in FIG. 2. For each reception frequency the PI code is additionally memorized as long as it is available. In addition, to each alternative frequency memorized in this first table a counter is assigned which is loaded when a PI code is established having a predetermined initial value, and then continuously decremented down to zero within a time span of roughly 10 minutes. The count of each alternative frequency is thus a measure of how current the identity code information is regarding the corresponding alternative frequency. As can be seen from FIG. 2 the more-significant bits (MSB) are memorized separate from the lesser significant bits (LSB) of the PI code in the first table.

In the first table shown in FIG. 2 all alternative frequencies signalled by the RDS data stream are memorized according to the currently set reception frequency without differentiation as to the quality of reception. This table is read into the RAM 28 of the microcomputer. In a departure from the microcomputers currently available, preference is given to one having a relatively large RAM since there is then the possibility of retaining more alternative frequencies in the table than is absolutely necessary. Shortly after the radio receiver is activated, at first only the PI code of the currently set transmitter and a few other transmitters checked after activation are available. The PI code belonging to the other alternative frequencies listed in the table is memorized as soon as tuning to these frequencies during a sufficiently long time span has enabled the PI code to be received.

Figure 3:
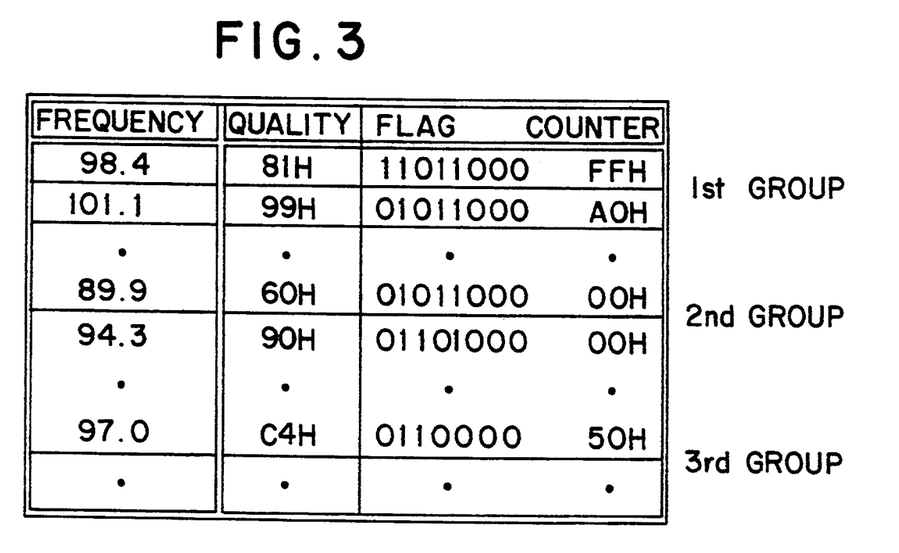
FIG. 3 is a second table as used in the method.

In the RAM 28, and in addition to the first table shown in FIG. 2, a further table as shown in FIG. 3 is formed. This table shown in FIG. 3 termed the table of alternative transmitters at the outset, contains relevant to each alternative frequency memorized in the first table shown in FIG. 2 three further entries, namely:
a) information concerning quality evaluation;
b) a flag; and
c) a counter.

The quality evaluation information is formed as the difference between the field-strength signal. FS and the signal ST indicating the degree of noise. To memorize this quality evaluation information a byte is used. As a result values between FFH and 00H can be stored. The quality evaluation undertaken in the noise detector 24 (FIG. 1) furnishes in an analog signal a measure of the field strength, co-channel, adjacent-channel and multi-path reception noise. In addition, a signal MP is made available which is primarily a measure of the resulting multi-path reception noise, but also incorporating co- and adjacent channel noise. This signal is more or less independent of the field strength. To be able to evaluate the audible quality of a frequency the quality signal is diminished by the multi-path reception noise signal. The result is memorized as the quality evaluation information in the second table shown in FIG. 3.

The flag comprises eight individual bits of which the first five are assigned as follows:
a) the first bit is set when no muting is required when checking the PI code,
b) the second bit is set when the PI code is checked and found to be correct;
c) the third bit is set when the PI code is recognized to be incorrect or no information is available regarding the PI code;
d) the fourth bit is set when the frequency is an alternative frequency;
e) the fifth bit is set when the frequency has already been checked.

The three remaining bits are not used and are available for other purposes.

When in the course of operation of the radio receiver the tuning frequency is changed, the frequencies no longer representing alternatives to the current tuning frequency remain in the table; however the fourth bit of the flag ("alternative frequency") is not set. Accordingly the information (PI correct or incorrect) are retained for other tuning frequencies of the transmitter chain.

Every time an attempt is made to change over to one of the alternative frequencies the frequencies alternative to the current tuning frequency are entered in the table of alternative transmitters should they not already be memorized there. On every entry of a frequency the current PI code is compared to the PI code held in the first table for this frequency as shown in FIG. 2. When the PI codes differ the third bit of the flag is set ("PI code incorrect"). If both PI codes are the same and if the corresponding counter in the first table (FIG. 2) has not been completely decremented the second bit ("PI code correct") is set.

If, however, the counter has already been decremented to zero or if still no PI code is entered in the first table for the corresponding frequency, none of the two bits of the flag is set. For this frequency there is then no safe information available as regards its PI code.

Irrespective of the count, when the compared codes agree, the first bit is set so that no muting is executed whilst the PI code is being checked, the next time a changeover is made to this frequency.

For each frequency entry a counter is provided in the table of alternative transmitters which is decremented every 2 to 3 seconds. To optimize time handling of the alternative transmitter table a distance-covered signal can be used for a mobile radio receiver (car radio) to decrement the counters.

When a frequency is established as the currently best frequency without information as to its PI code already being available, the PI code is checked after the tuner is set to this frequency. Within a certain time period the correct PI code must be received; otherwise the third bit ("PI code incorrect") is set in the flag belonging to this frequency and the system switched back to the original tuning frequency.

To avoid establishing incorrect frequencies as frequencies not having a correct PI code, when the conditions for reception are poor, a minimum threshold is introduced for the quality as of which frequencies having an unknown PI code can be set and checked as regards their PI code.

When no PI code is received for a set frequency within approx. 1 second and if the counter belonging to this frequency has already been decremented to zero in the table of alternative transmitters, this value is set to FFH, but the third bit of the flag ("PI code incorrect") is not set, and the system is switched back to the original tuning frequency.

If this frequency is again evaluated in a repeat tuning attempt as the best current frequency, its quality must then exceed a second, increased threshold, as long as the counter belonging to it still has a value greater than zero, so that it can be set and its PI code checked. If this is the case and should again no correct PI code be received within approx. 1 second, the third bit of the flag ("PI code incorrect") is set and the system switched back to the original tuning frequency.

Proceeding in this way achieves, on the one hand, alternative frequencies having a correct PI code being accepted already early, i.e. when the quality of reception is still low whilst, on the other hand, avoiding frequencies which are not correct from being wrongly identified as frequencies having an incorrect PI code under conditions of poor reception.

In the presence of tuning frequencies having a correct PI code and prior to attempting a changeover, instead of the counter a value is entered which represents existing multi-path reception noise. When establishing the quality of a checked frequency this value is deducted from the measured quality, since within the few milliseconds required for checking no judgement can be made as to multi-path reception noise. Since, however, this value representing multi-path reception noise becomes obsolete for frequencies which are not set, it too is decremented every 2 to 3 seconds.

Once all alternative frequencies concerned have been checked the table of alternative transmitters is resorted. In resorting three groups are formed. The first group which is highest in priority lists all alternative frequencies in which the second bit of the flag ("PI code correct") is set, as long as the corresponding counter is not decremented to zero. The second group which lies between the first and third in priority lists all alternative frequencies for which the second or third bit of the flag is set or not set, i.e. in which the PI code is unknown or has been identified as not being correct. Here, it should be noted that a classification in the second group will only result when the corresponding counter has already been decremented to zero.

In conclusion, the third group contains the alternative frequencies for which the third bit of the flag is set, i.e. in which the PI code was recognized as not being correct and the corresponding counter of which is still to be decremented to zero, so that the identity code can still be classified as being current.

Within each group the priority is determined by the value of the information evaluating the quality so that alternative frequencies offering a higher probability of leading to a good result in reception are checked first.

Following this description of how the method according to the invention provides for dynamic handling of the table of alternative transmitters the criteria will now be explained with reference to FIGS. 4a thru 4d for deciding whether an attempt should be made to tune the system to one of the alternative frequencies.

Figure 4A:
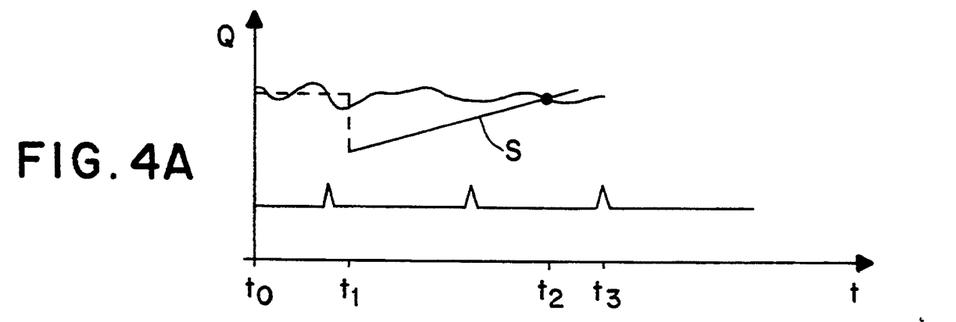
FIGS. 4a thru 4d are diagrams illustrating the criterion for changing over to an alternative transmitter.
Figure 4B:
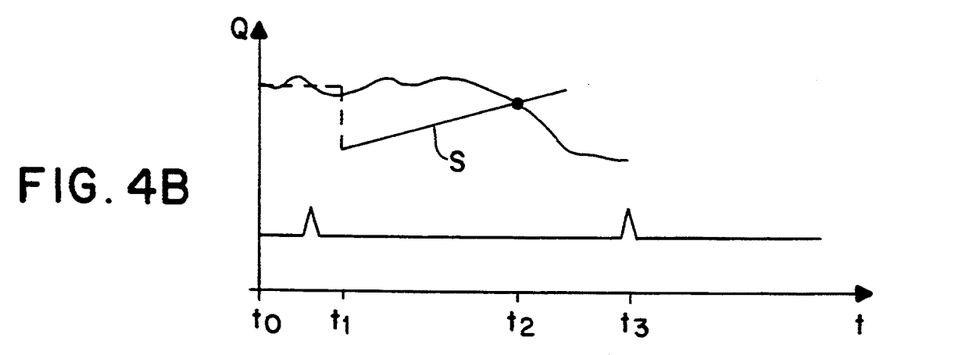
Figure 4C:
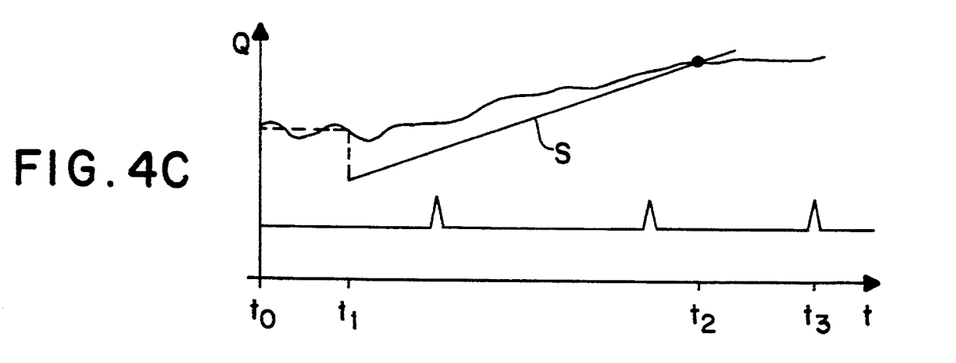
Figure 4D:
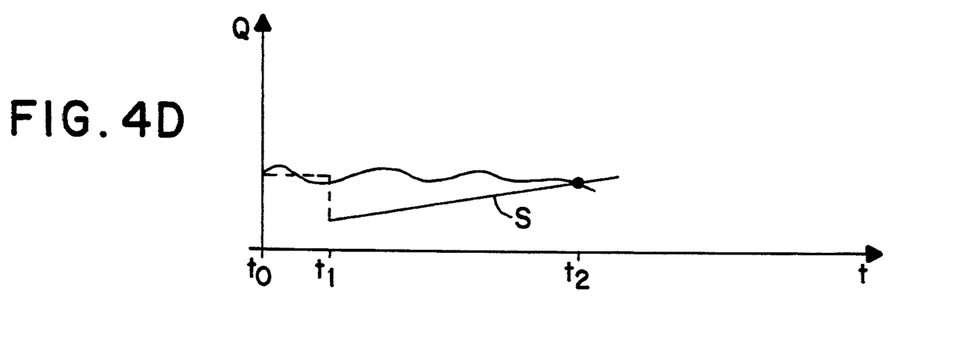

In the diagrams of FIGS. 4a thru 4d the ordinate is the value Q of the quality evaluation information for the currently set transmitter and the abscissa is the time t. The value Q changes with time t and its average can remain more or less constant (FIG.4a), become less (FIG.4b) or become more (FIG.4c). During a predetermined time span of $t_0$ to $t_1$ the average c the magnitude Q is formed. From this average a predetermined amount is deducted, the resulting diminished average then forming as of time point $t_1$ a threshold value to which the value of the quality evaluation information is compared. This threshold value increases continuously in time as of time point point $t_1$, as represented by the straight line S in FIGS. 4a thru 4d. As is evident from comparing FIGS. 4a and 4d, the slope of this straight line S will differ depending on the absolute value of the quality evaluation information: when the quality is good the threshold value will increase quicker than when the quality is less. In the FIGS. 4a thru 4c it should be noted that the scale particularly on the time axis does not correspond to that in reality, otherwise representing the slope of the straight line S would not be possible.

Changeover to one of the alternative frequencies is not possible until the value Q of the quality evaluation information at time point $t_2$ has fallen below the threshold value S. As shown in FIG. 4a this can happen when the threshold value S exceeds the value Q or, however, as shown in FIG. 4b when the value Q drops below the threshold value S. In the case of FIG. 4c both the value Q and the threshold value S having an increasing tendency and thus the condition that the value Q has dropped below the threshold value S does not materialize until a lengthy time span has passed at time point $t_2$. At this time point $t_2$ there is still no changeover to an alternative frequency, however. Instead the system first waits for the release by another event, namely the occurrence of a special noise in reception. In FIGS. 4a, 4b and 4c the signal MP (FIG. 1) is also shown, indicating the occurrence of noise in multi-path reception. Although this noise occurs only briefly it is a particular nuisance. The changeover to the alternative frequency highest in priority in the table of alternative transmitters, therefore, results when noise first occurs after time point $t_2$.

This event is entered in FIGS. 4a, 4b and 4c at time point $t_3$.

Figure 5A:
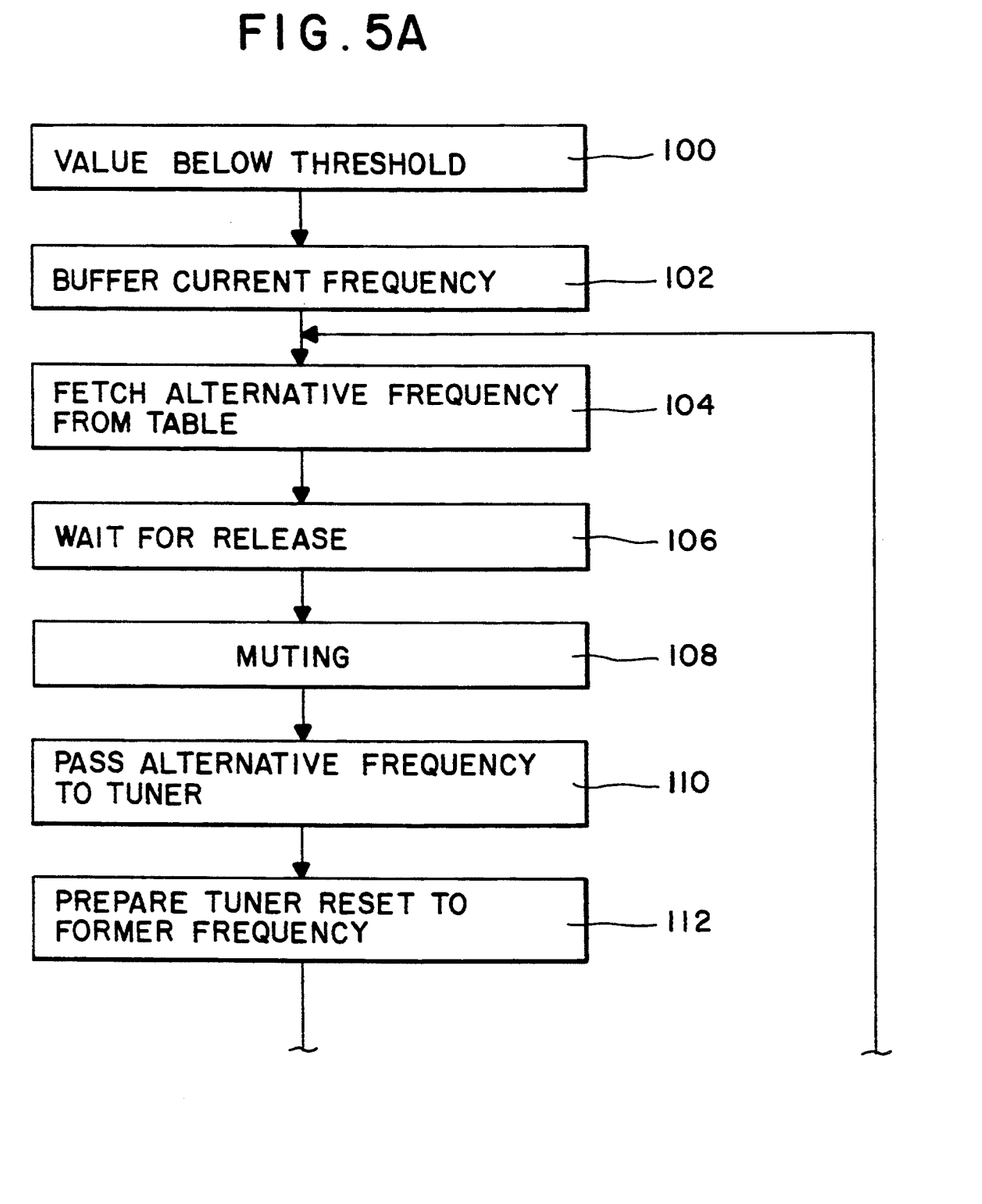
FIGS. 5a and 5b is a flow chart illustrating checking an alternative frequency.
Figure 5B:
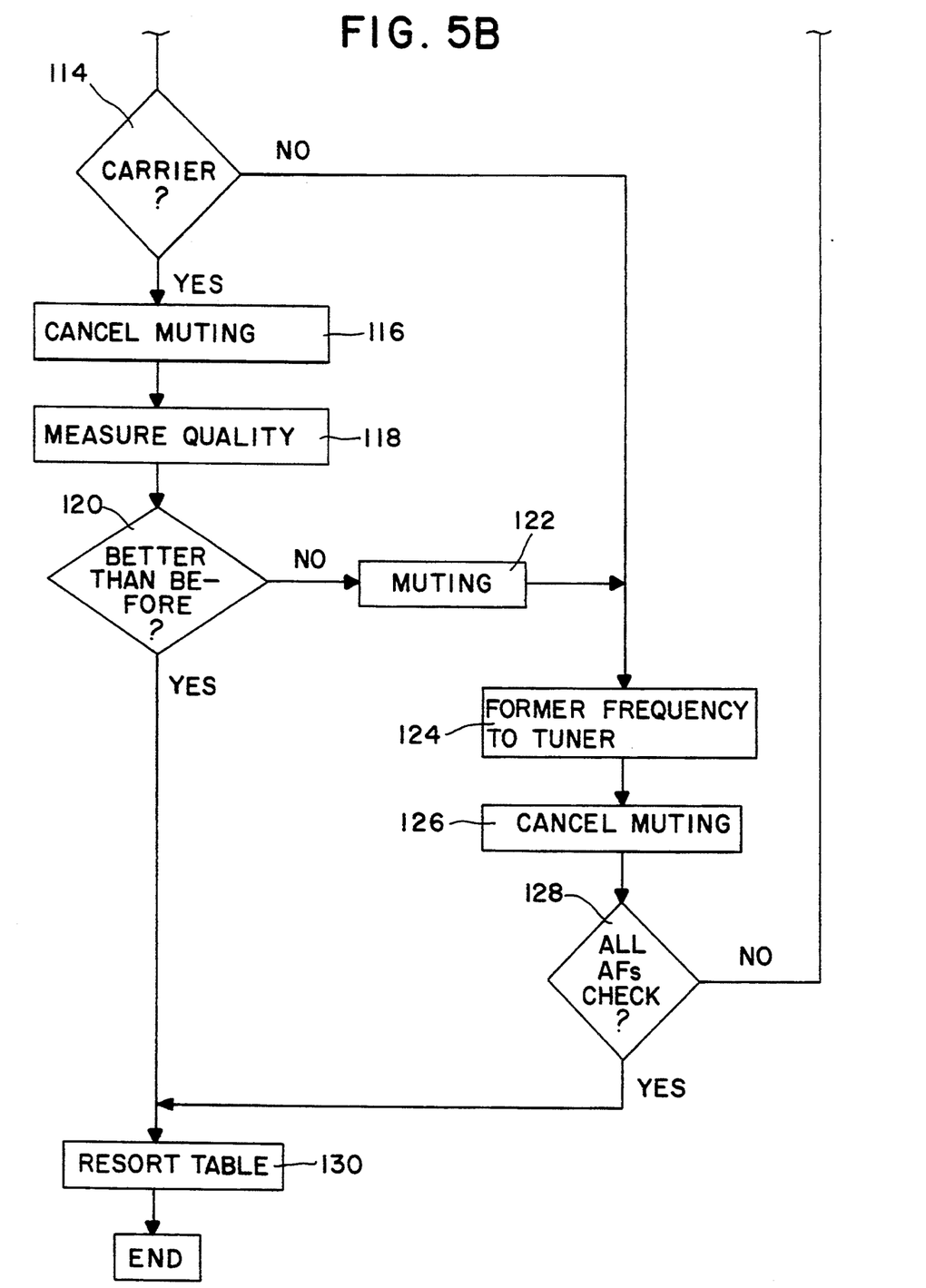

With reference to FIGS. 5a and 5b the procedure for tuning to one of the alternative frequencies will now be described in more detail.

Once the threshold value S is fallen short of in step 100, the currently set frequency of reception is buffered in step 102. Then, in step 104, the alternative frequency highest in the priority is fetched from the table of alternative transmitters. In step 106 there is a wait for the release, i.e. the occurrence of noise in reception. As soon as this occurs muting is activated step 108 to bridge the time span for tuning to the new tuning frequency. To accelerate any reset necessary to the tuning frequency previously set, this reset of the tuner to the former tuning frequency is made ready in step 112.

In step 114 a check is then made to see whether a carrier is received at the newly set frequency. When no carrier is received the frequency set previously in step 124 is again applied to the tuner and in step 126 muting is cancelled. If, however, a carrier is found in step 114, muting can be cancelled in step 116. Then in step 118 the quality of the new transmitter is measured. A check is then made in step 120 to see whether the newly set alternative frequency produces a better quality of reception that that of the frequency set before. If the quality of reception is better than before the setting made is confirmed. Otherwise repeat muting follows in step 122 to permit tuning to the frequency set before, as already explained in steps 124 and 126. If it is established in step 128 that all of the alternative frequencies concerned have still not been checked, a jumpback is made to step 104; otherwise and also when the quality was found to be better in step 120, the table of alternative transmitters (FIG. 3) is resorted in step 130, this completing the procedure.

This procedure is then repeated with reference to FIGS. 4a thru 4d.

We claim:

1. A method for controlling a microcomputer-controlled radio receiver while tuning to one of several transmitters, broadcasting the same program on different carrier frequencies, which best satisfies predetermined requirements for reception quality, receiving a signal and making use of radio data system information in said received signal, deriving from said received signal identity codes for said transmitters, comprising the steps of:
    a) obtaining data from the radio data system information as to alternative frequencies of each transmitter to which the receiver is to be tuned, and memorizing and sorting a table of alternative frequencies associated with said identity codes;
    b) tuning to one of said alternative frequencies memorized in said table, evaluating the alternative frequency to which the receiver is presently tuned to derive quality evaluation information, associating said quality evaluation information with the presently tuned alternative frequency, and memorizing said quality evaluation information in said table;
    c) associating and memorizing actuality information with each quality evaluation information for each alternative frequency to which the receiver has been tuned, said actuality information representing the time elapsed since each quality evaluation is obtained; and
    d) prior to tuning the receiver to one of said alternative frequencies, selecting among said alternative frequencies, on the basis of a priority scheme, wherein both of said quality evaluation information and said actuality information are taken into account by giving a higher priority to alternative frequencies which have a higher degree of actuality.

2. The method of claim 1, wherein the step of deriving an identity code from the radio data system information for an alternative frequency to which the receiver is presently tuned, further comprises: checking the derived identity code for matching with an identity code associated with one of said alternative frequencies stored in said table, and an alternative frequency stored in said table is flagged when the associated identity code for the alternative frequency stored in said table matches said derived identity code.

3. The method of claim 2, further comprises the step of forming a first group among said alternative frequencies in said table which comprise only flagged alternative frequencies.

4. The method of claim 3, the step of forming a first group further comprises selecting from said flagged alternative frequencies in said first group only alternative frequencies with a predetermined minimum degree of actuality.

5. The method of claim 4, further comprising the step of not muting said receiver when tuning to one of said flagged alternative frequencies which is not within said first group due to an insufficient degree of actuality.

6. The method of claim 3, further comprising the steps of testing only said alternative frequencies of said first group for better reception quality when the receiver is currently tuned to an alternative frequency satisfying a predetermined minimum reception quality requirement.

7. The method of claim 3, further comprising step of testing said alternative frequencies of said first group better reception quality regardless of whether or not an identity code is received.

8. The method of claim 3, further comprising the steps of forming second and third groups among said alternative frequencies in said table, alternative frequencies of said second group being given a higher priority than those in said third group, and containing those alternative frequencies which are a predetermined minimum degree of actuality, and said third group containing frequencies which are associated with an unmatched identity code and have more than said predetermined minimum degree of actuality.

9. The method of claim 1, further comprising the step of testing for a better reception quality with any of said alternative frequencies, releasing said step of testing based on a current reception quality value becoming less than an evolving threshold;
    determining said evolving threshold by further performing the steps of:
    a) tuning the receiver to a current alternative frequency, deriving an average reception quality value by averaging a reception quality signal over a predetermined period of time;
    b) diminishing said average reception quality value by a predetermined amount producing an initial value of said evolving threshold; and
    c) increasing said evolving threshold value in relation to time until said current reception quality value becomes less than said evolving threshold.

10. The method of claim 9, further comprising the step of increasing said evolving threshold value, wherein a rate of change of said evolving threshold value is proportional to the current reception quality value.

11. The method of claim 9, wherein the step of testing for a better reception without any of said alternative frequencies further comprises not releasing said step of testing until detecting momentary noise in said received signal.

12. The method of claim 1, further comprising representing each actuality information by a counter associated with an alternative frequency in said table and decrementing said counter with time.

13. A method of controlling a microcomputer-controlled radio receiver while tuning to one of several transmitters, broadcasting a currently received program on different carrier frequencies, which best satisfies predetermined requirements for reception quality, receiving a signal, making use of radio data system information in said received signal and using at least one receiver section, comprising the steps of: deriving alternative frequency data from said radio data system information, storing said radio data system information in a random access memory with an associated transmitter identity code, forming a sorted table of alternative frequencies, checking said alternative frequencies in said table for a match with said associated transmitter identity code, flagging each alternative frequency that has been matched with one of said associated transmitter identity codes; wherein muting is not performed by said receiver while tuning to one of said alternative frequencies which has been flagged and muting is performed by said receiver while tuning to one of said alternative frequencies which has not been flagged.

14. A method of controlling a microcomputer-controlled radio receiver while tuning to one of several transmitters, broadcasting a currently received program on different carrier frequencies, which best satisfies predetermined requirements for reception quality, receiving a signal, making use of radio data system information in said received signal and using at least one receiver section, comprising the steps of: deriving alternative frequency data from said radio data system information, storing in a random access memory said radio data system information with an associated transmitter identity code to form a sorted table of alternative frequencies, testing said alternative frequencies for determining corresponding reception quality values for each alternative frequency, forming said reception quality values by taking the difference of a field strength indication signal for the alternative frequency and a noise indication signal for the alternative frequency, storing each reception quality value in said random access memory, associating, with each respective alternative frequency, each respective reception quality value.

15. The method of of claim 14, the step of determining a reception quality value further comprises calculating each of said reception quality values on the basis of a predetermined minimum field strength.

* * * * *